US005407783A

United States Patent [19]

Caruso

[11] Patent Number: 5,407,783
[45] Date of Patent: Apr. 18, 1995

[54] PHOTOIMAGEABLE COMPOSITIONS CONTAINING SUBSTITUTED 1, 2 DIHALOGENATED ETHANES FOR ENHANCED PRINTOUT IMAGE

[75] Inventor: Thomas C. Caruso, Endwell, N.Y.

[73] Assignee: E. I. Du Pont de Nemours and Company, Wilmington, Del.

[21] Appl. No.: 205,211

[22] Filed: Mar. 9, 1994

Related U.S. Application Data

[63] Continuation-in-part of Ser. No. 93,152, Jul. 22, 1993, abandoned.

[51] Int. Cl.6 .................. G03C 1/725; G03F 7/025
[52] U.S. Cl. .................................. 430/288; 430/281; 430/338; 430/340; 430/344; 522/8; 522/9; 522/23
[58] Field of Search ............... 430/281, 286, 288, 338, 430/340, 344

[56] References Cited

U.S. PATENT DOCUMENTS

| | | | |
|---|---|---|---|
| 4,168,982 | 9/1979 | Pazos | 430/917 |
| 4,297,435 | 10/1981 | Jolly et al. | 430/270 |
| 4,298,678 | 11/1981 | McKeever | 430/281 |
| 4,552,830 | 11/1985 | Reardon et al. | 430/281 |
| 4,634,657 | 1/1987 | Holman | 430/281 |
| 5,030,548 | 7/1991 | Fujikura et al. | 430/281 |
| 5,049,480 | 9/1991 | Nebe et al. | 430/281 |
| 5,057,398 | 10/1991 | Frommeld et al. | 430/281 X |

*Primary Examiner*—Marion E. McCamish
*Assistant Examiner*—Bernard Codd

[57] ABSTRACT

Photoimageable compositions, photoimageable resist compositions, and photoimageable resist elements that afford enhanced, storage stable printout images are disclosed which include a substituted 1,2-dibromoethane and a leuco dye.

10 Claims, No Drawings

PHOTOIMAGEABLE COMPOSITIONS CONTAINING SUBSTITUTED 1, 2 DIHALOGENATED ETHANES FOR ENHANCED PRINTOUT IMAGE

RELATED APPLICATION

The present application is a continuation-in-part of Ser. No. 08/093,152, filed Jul. 22, 1993, now abandoned.

FIELD OF THE INVENTION

This invention relates to resist compositions containing substituted 1,2-dihalogenated ethanes that provide enhanced printout images in combination with leuco dyes on substrates used to make printed circuit boards, lithographic plates, relief images and various other uses in the photographic arts.

BACKGROUND OF THE INVENTION

Photopolymerizable resist materials are known, for example, from U.S. Pat. No. 3,469,982 which describes a film resist with a sandwich structure in the form of a photopolymerizable layer between a cover sheet and a temporary support. This film can be laminated onto a copper base, exposed imagewise and developed, whereby a resist layer is formed. The copper panel with the resist image can be selectively etched, electroplated, or treated with solder to form a printed circuit board.

Prior art photopolymerizable compositions often contain small amounts of a leuco dye which upon photoimaging is converted to its colored form. This color in the exposed portions of the resist is referred to as the printout image. The printout image enhances the visibility of the exposed areas and facilitates inspection for imperfections in the image both prior to and after development.

Photoimaging compositions useful for forming printout images are known. Yamada et al. U.S. Pat. No. 3,476,562 and Lewis et al. U.S. Pat. No. 3,769,023 disclose printout image formation using compositions containing haloorganic compounds. However the images formed are relatively poor.

U.S. Pat. No. 4,065,315 to Yamazaki et al. discloses the use of halogenated aliphatic amides to enhance the printout image of compositions containing a variety of dye bases, while Reardon in U.S. Pat. No. 4,343,885 discloses the use of fluoran colorformers with a variety of halogenated materials as the image forming system. In U.S. Pat. 4,552,830 Reardon and Lipson disclose the use of aliphatic carbonylic halides as activators for color formation by leuco dyes, with the preferred compounds being halogenated amides of dicarboxylic acids.

Brominated sulfones such as tribromomethyl phenyl sulfone (BMPS) have been reported as printout image enhancers with leuco dyes as disclosed in Japanese examined Patent 3-68,376.

Likewise hexaarylbiimidazoles (HABIs) have long been known to form radicals which can oxidize triarylmethane dyes to their colored form as is disclosed in U.S. Pat. No. 3,445,234. The use of HABIs and BMPS together as printout image enhancers is disclosed by Fujikura et al. in U.S. Pat. No. 5,030,548.

U.S. Pat. No. 4,634,657 discloses the use of leuco dyes along with substituted 1,2-dibromoethanes of the formula:

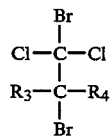

in which $R_3$ and $R_4$ are independently hydrogen, chlorine or fluorine. While these compositions form high contrast images, they are rather volatile so that image instability can sometimes occur in films even at room temperature. Polyhalogenated materials such as these and their polyhalogenated byproducts are also undesirable from an environmental standpoint.

Other compositions such as those based on tribromomethylphenyl sulfone or lophine dimers tend to be thermally unstable when heated to higher temperatures for short periods or upon extended storage either in solution or in a film. The instability can be manifested by premature color formation in solution or in a film. Thermal instability can also be manifested by a lowering of the temperature for onset of polymerization of the monomer system which can be a problem if the composition is exposed to high temperatures during film manufacture or during process of use.

Many printout systems are useful only in the presence of acid, or with specific monomers.

Printout enhancers that produce a high contrast image when used in small amounts are also desirable for environmental reasons as regulation on the use of halogenated materials become more stringent. Thus, polyhalogenated materials that must either be used in large amounts to produce high contrast images, or materials like halogenated 1,2-dibromoethanes which produce polyhalogenated byproducts upon reaction, are less desirable as ingredients. Materials which can be used to produce films by melt extrusion instead of solvent coating likewise are desirable from an environmental standpoint since the melt extrusion process lowers air emissions and eliminates residual solvents in the film.

Thus, materials that greatly enhance printout images, without seriously lowering the thermal stability of the film composition are highly desirable to enhance the shelf life of photoimageable film compositions under ambient or elevated temperature conditions and for the preparation of films with a thermal history, such as by melt coating.

SUMMARY OF THE INVENTION

The current invention of a printout image system satisfies the need for a high contrast printout image in a thermally stable, photoimageable resist that can be formulated with a variety of initiators, leuco dyes, monomers, binders, and processes, and is comprised of:

(a) a substituted 1,2-dihalogenated ethane having the structure

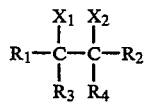

in which:

$X_1$ and $X_2$ are independently either bromine or chlorine;

$R_1$ is $C_6$-$C_{10}$ aryl, or aroyl, and $R_2$ is $C_6$-$C_{10}$ aryl, aroyl, acyl, or an electron withdrawing group other than halogen, $R_3$ and $R_4$ independently are $C_6$-$C_{10}$ aryl, $C_1$-$C_{10}$ alkyl, H, or an electron withdrawing group other than halogen with the proviso that any two of $R_1$, $R_2$, $R_3$ and $R_4$ can form a $C_5$-$C_8$ membered ring structure;

with proviso that when $R_1$ or $R_3$ is $C_6$-$C_{10}$ aryl, $R_2$ and $R_4$ are not aryl;

(b) a leuco dye;

(c) a photoinitiator or photoinitiator system;

(d) a monomer;

(e) a polymeric binder; and (f) a optional thermal inhibitor.

In another embodiment, this invention is a photoimageable composition with a high contrast printout image comprised of (a), (b), and (c) supra.

DETAILED DESCRIPTION OF THE INVENTION

This invention provides a photoimageable resist composition with a thermally stable printout image (POI) system having a substituted 1,2-dihalogenated ethane and a leuco dye. This POI system is capable of withstanding a variety of coating processes, such as melt coating at 450° C. or coating from a solution or an aqueous dispersion. In particular, the composition of this invention is capable of withstanding a melt coating process at about 250°–400° F. without a significant loss of POI strength or other desirable resist properties, such as storage stability e.g., 1 year at 50° F. and 50% relative humidity.

A photoimageable resist to be used for printed circuit manufacture generally is comprised of, in addition to POI chemistry, a photoinitiator or photoinitiator system, at least one monomer, at least one binder, and other ingredients to enhance manufacturability, storage stability or end-use performance. The POI system of this invention contains a leuco dye. Free radicals that oxidize leuco dyes can generally be produced by irradiation of a photoinitiator, photoinitiator system or other types of organic compounds capable of generating free radicals, such as organohalogens. The photoimageable resist compositions described in this invention contain substituted 1,2-dihalogenated ethanes as free radical generators and which are surprisingly stable under a variety of production processes and typical film storage conditions. These resist compositions are useful for such printed circuit processing steps as etching, plating and as permanent masks for application of solder.

The photoresist compositions of this invention can be made to apply in a liquid form or, more generally, in the form of a film. The photoresist may be applied by conventional means to a temporary support film and dried or alternatively cast in a melt coating process onto a temporary support film. This invention is particularly suited to a melt coating process. Preferably, a cover film is laminated to the bare surface of the photoresist so that it is sandwiched between and protected by the support film and cover film.

The thickness of the photoresist will depend on the type of printed circuit processing, such as etching or plating, or if used as a solder mask.

Photoimageable Resist Composition

Substituted 1,2-Dihalogenated Ethane

The 1,2-dihalogenated ethane essential to this invention comprises a substituted 1,2-dihalogenated ethane having the structure:

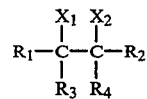

wherein $R_1$-$R_4$ and $X_1$-$X_2$ are defined as given supra in the invention summary section. Furthermore, when $R_1$-$R_4$ is unsubstituted or substituted $C_6$-$C_{10}$ aryl group, the substitution may consist of a $C_1$-$C_4$ alkyl group or an electron withdrawing group, such as cyano or nitro.

The halogen ($X_1$ and $X_2$) is preferably bromine. The electron withdrawing groups are those known in the art and include carboxy, carboxy ester, cyano, nitro, and the like. Suitable compounds include those derived from the bromination of substituted stilbenes, chalcones, and styrenes. Examples of suitable compounds include 2,3-dibromo-3-phenylpropiophenone, 10,11-dibromo-dibenzosuberone, ethyl 2,3-dibromo-3-phenylpropionate, 2,3-dibromo-3-phenylpropionic acid, trans-1,2-dibromoacenaphthene, 2,3-dibromo-3-(p-chlorophenyl)propionic acid, 1,2-dibromoacenaphthene, 1,2-dibromo-1,2-dibenzoylethane, 3,4-dibromo-4-phenyl-2-butanone, 2,3-dibromo-3-(p-nitrophenyl)propiophenone, 2,3-dibromo-3-(p-cyanophenyl)propiophenone, 2-bromo-2-(alpha-bromobenzyl)-1-indanone, and 2-bromo-2-(alpha-bromo-p-cyanobenzyl)-1-indanone.

Alkyl groups are comprised of one to twelve carbon atoms and preferably one to four. The electron withdrawing groups are those known in the art and are generally represented by halogen, carboxy, carboxyester, cyano, nitro, and the like.

Examples of preferred 1,2-dibromoethanes of this invention are trans-10,11-dibromodibenzosuberone; ethyl 2,3-dibromo-3-phenylpropionate; 2,3-dibromo-3-phenylpropiophenone; trans-1,2-dibromoacenaphthene; 2,3-dibromo-3-phenylpropionic acid and 2,3-dibromo-3-(para-chlorophenyl)propionic acid.

The quantity of substituted 1,2-dibromoethane (or substituted 1,2-dihalogenated ethane) is generally from 0.01 to 10 parts by weight relative to the total components of the photoimageable composition and the preferred range is from 0.1 to 1.0 parts by weight.

Leuco Dye

The leuco form of the dye, which comprises one component of the photoimaging composition in the present invention, is the reduced form of the dye having one or two hydrogen atoms. The removal of these hydrogens together with an additional electron in certain cases produces the dye, i.e. a differently colored compound. When the leuco form has only one removable hydrogen the resulting dye is cationic. Sometimes when the latter type dye is used, a mineral acid or acid supplying compound, e.g. para-toluenesulfonic acid (PTS), is also used with the leuco form of the dye. Such dyes have been described for example in U.S. Pat. No. 3,445,234, column 2, line 49 to column 8, line 55. The following classes are included:

(a) aminotriarylmethanes (b) aminoxanthenes (c) aminothioxanthenes (d) amino-9,10-dihydroacridines (e) aminophenoxazines (f) aminophenothiazines (g) aminodihydrophenazines
(h) aminodiphenylmethanes
(i) leuco indamines
(j) aminohydrocinnamic acids (cyanoethanes, leuco methines)
(k) hydrazines
(l) leuco indigoid dyes
(m) amino-2,3-dihydroanthraquinones
(n) tetrahalo-p,p'-biphenols
(o) 2(p-hydroxyphenyl)-4,5-diphenylimidazoles
(p) phenethylanilines Of these leuco forms (a) through (i) form the dye by losing one hydrogen atom, while the leuco forms (j) through (p) lose two hydrogen atoms to produce the parent dye. Aminotriarylmethanes are preferred. A general class of preferred aminotriarylmethanes are those wherein at least two of the aryl groups are phenyl groups having an $R_1R_2N$-substituent in the position para to the methane carbon wherein the $R_1$ and $R_2$ groups are selected from hydrogen, $C_1$ to $C_{12}$ alkyl or cycloalkyl, hydroxyalkyl, alkoxyalkyl, cyanoalkyl, benzyl, or $R_1$ and $R_2$ together form a ring of 3 to 10 atoms together with the amino nitrogen in which the carbon atoms of the ring may or may not have further substitution.

The third aryl group may be the same or different from the first two, and when different is selected from:
(a) Phenyl which can be substituted with lower alkyl, lower alkoxy, chloro, diphenylamino, cyano, nitro, hydroxy, fluoro, or bromo
(b) Napthyl which can be substituted with amino, dialkylamino or alkylamino
(c) Pyridyl which can be substituted with alkyl
Indolinylidene which can be substituted with alkyl. Preferably $R_1$ and $R_2$ are alkyl of 1–6 carbon atoms or hydrogen.

Examples of preferred dyes include leuco crystal violet, leuco ethyl violet and higher alkylated analogs.

The presence of a leuco dye in combination with the 1,2-dihalogenated ethane compound of this invention produces a printout image where it is desired to identify polymerized areas. The leuco dye is generally present in a mole ratio of leuco dye to the substituted 1,2-dihalogenated ethane compound of 0.1 to 10 with a preferred range of 0.2 to 4.

Photoinitiator or Photoinitiator System

A photoinitiator is also present in the photopolymerizable composition. The photoinitiator can be of a specific type, such as a halogenated-2,5-cyclohexadienone, benzophenone, alkylaryl ketone or diketone type, or mixtures thereof.

Any of a variety of free radical generating photoinitiators can be used in the current invention. Benzophenone derivatives such as benzophenone, bis-4,4'-dimethylaminobenzophenone (Michler's ketone), bis-4,4'-diethylaminobenzophenone (ethyl Michler's ketone), benzophenones singly or multiply substituted with other alkylamino groups, chloro, methoxy etc. Preferred compounds include benzophenone, ethyl Michler's ketone, and Michler's ketone. Also substituted xanthones, thioxanthones, anthrones, and fluorenones are useful initiators, with alkyl, chloro, and alkoxy substituted thioxanthones being preferred. Substituted cyclohexadienones such as those described in Sysak, U.S. Pat. No. 4,341,860 can be also be used, with preferred compounds having both an alkyl and a trichloromethyl substituent in the 4 position.

Useful alkylarylketone derivatives include ketaldonyl alcohols such as benzoin, pivaloin, and acyloin ethers such as benzoin alkyl ethers, benzoin aryl ethers, alpha-hydrocarbon substituted aromatic acyloins, benzoin dialkyl ketals, benzil, benzoin esters, O-acylated oximinoketones, and alpha-amino ketones such as alpha-aminoactophenone derivatives. Substituted or unsubstituted polynuclear quinones such as 9,10-anthroquinones, 1,4-naphthquinones, and phenanthrene quinones are also possible initiators.

Tertiary amines suitable as electron and/or hydrogen donors can also be used as part of the initiating system. Especially preferred are tertiary aromatic amines such as substituted N,N-dialkylaminobenzene derivatives such as ethyl 4-(dimethylamino)benzoate.

Useful diketones include biacetyl, 2,3-dibenzoyl-2-norbornene, benzoylbenzal chloride, 2,2-dibromo-2-(phenylsulfonyl)propanedione, alpha-naphthil, 2,3-bornanedione, phenylpuruvic acid and 2,4-pentanedione. Representative quinones that can be used include 4-benzoquinone, 2-benzoquinonediazide, anthraquinone, 2-methylanthraquinone, 2,6-dimethoxyanthraquinone, 2,4,8-trichloroanthraquinone, aminoanthraquinone, 1,4-napthoquinone derivatives and phenanthrenequinones.

Also useful as photoinitiators are 2,4,5-triphenylimidazolyl dimers in combination with chain transfer agents, or hydrogen donors, such as are disclosed in U.S. Pat. Nos. 3,479,185; 3,784,557; 4,311,783; and 4,622,286. Preferred hexaarylbiimidazoles (HABI) are 2-ortho-chlorosubstituted hexaphenylbiimidazoles in which the other positions on the phenyl radicals are unsubstituted or substituted with chloro, methyl or methoxy. The most preferred initiator of this class is ortho-Cl-HABI, i.e., 2-(2-chlorophenyl)-4,5-diphenylimidazole dimer, 1,1'-biimidazole, 2,2'-bis(ortho-chlorophenyl)-4,4',5,5'-tetraphenyl-imidazole dimer.

Hydrogen donor compounds that function as chain transfer agents in the photopolymer compositions include: 2-mercaptobenzoxazole, 2-mercaptobenzothiazole, 4-methyl-4H-1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof.

Some preferred photoinitiators and photosensitizers are HABI, benzophenone, ethyl Michler's ketone, p-dialkylaminobenzoate alkyl esters, cyclohexadienones, xanthones, thioxanthones, benzil dialkyl ketals, aminoacetophenones, benzoin, benzoin dialkyl ethers, or combinations thereof where alkyl contains 1 to 4 carbon atoms.

Monomer

The monomer provides the capability to polymerize the photoresist coating composition and contributes to the overall properties of the resist. In order to effectively do so, the monomer should contain at least one ethylenically unsaturated group capable of undergoing polymerization on exposure to actinic radiation.

The preferred monomeric compounds are polyfunctional, but monofunctional monomers such as (meth)a- crylate esters of polycaprolactone can also be used. Suitable monomers which can be used as the sole monomer or in combination with others include the following: 1,4-butanediol diacrylate, 1,5-pentanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, glycerol triacrylate, trimethylolpropane triacrylate, pentaerythritol triacrylate, polyoxyethylated trimethylolpropane tri(meth)acrylate, polypropoxylated trimethylolpropane tri(meth)acrylate and similar compounds as disclosed in U.S. Pat. No. 3,380,831, 2,2-di(p-hydroxyphenyl)propane diacrylate, pentaerythritol tetraacrylate, 2,2-di(p-hydroxyphenyl)propane dimethacrylate, triethylene glycol diacrylate, polyoxyethyl-2,2-di(p-hydroxyphenyl)propane dimethacrylate, bisphenol A diacrylate, di-(3-methacryloxy-2-hydroxypropyl)ether of bisphenol A, di-2-methacryloxyethyl ether of bisphenol A, di-(3-acryloxy-2-hydroxypropyl)ether of bisphenol A, di-2-acryloxyethyl ether of bisphenol A, di-(3-methacryloxy- 2-hydroxypropyl)ether of tetrachloro-bisphenol A, di-2-methacryloxyethyl ether of tetrachloro-bisphenol A, di-(3-methacryloxy-2-hydroxypropyl)ether of tetrabromo-bisphenol A, di-2-methacryloxyethyl ether of tetrabromo-bisphenol A, di-(3-methacryloxy-2-hydroxypropyl)ether of 1,4-butanediol, triethylene glycol dimethacrylate, trimethylolpropane trimethacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, 1,2,4-butanetriol trimethacrylate, 2,2,4-trimethyl-1,3-penatanediol dimethacrylate, pentaerythritol trimethacrylate, 1-phenylethylene-1,2-dimethacrylate, pentaerythritol tetramethacrylate, 1,5-pentanediol dimethacrylate, 1,4-benzenediol dimethacrylate, 1,3,5-triisopropenyl benzene tripropylene glycol diacrylate and polycaprolactone diacrylate.

Preferred monomers include polyethoxylated trimethylolpropane triacrylate, trimethylolpropane triacrylate tripropylene glycol diacrylate and triethylene glycol dimethacrylate.

The quantity of total monomer is generally from 10 to 50 parts by weight relative to the total components of the photoimageable resist.

Binder

Suitable binders which can be used alone or in combination with another include the following: polyacrylate and alpha-alkyl polyacrylate esters, e.g., polymethyl methacrylate, polyethyl methacrylate, and copolymers of various acrylic monomers; polyvinyl esters, e.g., polyvinyl acetate, polyvinyl acetate/acrylate, polyvinyl acetate/methacrylate and hydrolyzed polyvinyl acetate; ethylene vinyl acetate copolymers; polystyrene polymers and copolymers, e.g., with maleic anhydride and esters; vinylidene chloride copolymers, e.g., vinylidene chloride/acrylonitrile, vinylidene chloride/methacrylate and vinylidene chloride vinyl actetate coploymers; polyvinyl chloride and copolymers, e.g., polyvinyl chloride/acetate; saturated and unsaturated polyurethanes; synthetic rubbers, e.g., butadiene acrylonitrile, butadiene/styrene/acrylonitrile, methacrylate/styrene/butadiene/acrylonitrile copolymers, 2-chlorobutadiene polymers, chlorinated rubber, and styrene/butadiene/styrene, styrene/isoproprene/styrene block copolymers; high molecular weight polyethylene oxides of polyglycols having average molecular weight from about 4000 to 1,000,000; polyvinylpyrrolidone and polyvinylpyrrolidone copolymers; epoxides, e.g., epoxides containing acrylate or methacrylate groups; copolyesters, e.g., those prepared from the reaction product of a glycol and a diacid; nylons or polyamides; cellulose esters; cellulose ethers; polycarbonates; polyvinyl acetals; polyformaldehydes.

Preferred binders are carboxylic acid containing copolymers such as those disclosed in U.S. Pat. Nos. 3,548,311 and 4,273,857, which are incorporated here by reference. Preferred binders are those comprised of comonomers of the structural unit:

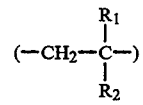

in which $R_1$ is H or alkyl; $R_2$ is phenyl or $CO_2R_3$; and $R_3$ is H or alkyl which is substituted or unsubstituted. Suitable comonomers which form the structural unit of the copolymer essential to this invention are styrene and unsaturated carboxylic acids and their derivatives such as (meth)acrylic acid and (meth)acrylates. Acrylic acid, methacrylic acid, methyl methacrylate, ethyl acrylate, butyl acrylate, butyl methacrylate and styrene are preferred. The binder copolymer of this invention can also be formed by direct copolymerization of one or more ethylenically unsaturated dicarboxylic acid anhydrides or their corresponding alkyl mono and diesters with one or more of the comonomers above. Suitable ethylenically unsaturated dicarboxylic acid anhydrides are for example, maleic anhydride, itaconic acid anhydride, and citraconic acid anhydride and alkyl esters such as the diisobutyl ester of maleic anhydride. The copolymer containing acid anhydride functionality can also be reacted with aliphatic or aromatic amines, or with alcohols.

When the photoimageable composition is coated onto a temporary support and the element is laminated to a substrate and photoprinted, development of the composition in aqueous media requires that the binder material should contain sufficient carboxylic acid groups to render the photoresist coating composition processable in aqueous alkaline developer. The coating layer on the substrate will be removed in portions which are not exposed to radiation but will be substantially unaffected in exposed portions during development by aqueous alkaline liquids such as wholly aqueous solutions containing 1% sodium or potassium carbonate by weight for a time of five minutes at a temperature of 40° C. The acid number of the binder should be within the range of 5 to 500 and preferably from about 20 to 250.

The quantity of total copolymer binder in the photoimageable resist composition is from about 30 to 80% by weight of the total components of the resist composition Cobinder may be present to optimize manufacturability, development or stripping properties, or performance in printed circuit steps such as electrolytic copper plating or copper etching.

Thermal Inhibitor

A thermal inhibitor is desirable in certain cases depending on the application and the identity of the leuco dye. In cases where the formulation will experience high temperatures such as melt extrusion, or another process where the resist may experience extended heating prior to exposure, the thermal inhibitor prevents the premature oxidation of the leuco dye to its colored form or the premature crosslinking of the monomer system. Likewise in systems using an easily oxidizable leuco dye such as leuco crystal violet, a thermal inhibitor may be desirable in order to stablize the formulation against premature color formation in solution prior to coating.

Thermal polymerization inhibitors that can be used in photopolymerizable compositions include the following: p-methoxyphenol, hydroquinone, alkyl and aryl substituted hydroquinones and quinones, phenols substituted with a variety of substituents such as tert-butyl catechol and 2,6-di-tert butyl-p-cresol, organophosphites, alkylated hydroxylamines, pyrogallol, copper resinate, naphthylamines, beta-naphthol, cuprous chloride, phenothiazine, pyridine, phenidone, nitrobenzene and dinitrobenzene, p-toluquinone and chloranil. Especially useful for thermal inhibitors are the nitroso compositions such as 1,4,4 trimethyl-2,3-diazabicyclo[3.2.2]-non-2-ene N,N-dioxide and related compounds that are disclosed in U.S. Pat. No. 4,168,982.

Temporary Support

Any of the support films known for use as such for a photoresist coating can be used in the present invention. The temporary support film, which preferably has a high degree of dimensional stability to temperature changes, may be chosen from a wide variety of polyamides, polyolefins, polyesters, vinyl polymers, and cellulose esters, and may have a thickness of from about 6 to 200 microns. A particularly suitable support film is polyethylene terephthalate having a thickness of about 25 microns.

Optional Materials or Additives

Cover Film

In conventional photoresist elements it is necessary or at least highly desirable to protect the photosensitive layer by a removable cover film in order to prevent blocking when it is stored in a roll form. The protective cover film is removed prior to lamination of the photoimagable element to a substrate.

The protective cover film may be selected from the same group of high polymer films described for the temporary support film, supra, and may have the same wide range of thicknesses; however, it is preferable to use a cover sheet that is relatively flexible under lamination conditions. A cover sheet of 25 microns thick polyethylene or polypropylene is especially suitable.

Other Components

Other compounds conventionally added to photopolymer compositions may also be present in the coating to modify the physical properties of the film. Such components include: adhesion modifiers, thermal stabilizers, photooxidants, colorants such as dyes and pigments, crosslinking agents, viscosity control agents, coating aids, wetting agents, release agents, and the like.

Some heterocyclic compounds improve adhesion of the coating to copper-clad substrates and/or prevent residue formation during processing. Suitable heterocyclic components include materials such as those disclosed in Hurley et al., U.S. Pat. No. 3,622,334, Jones, U.S. Pat. No. 3,645,772, and Weed, U.S. Pat. No. 4,710,262. Preferred heterocyclic components include benzotriazole, 5-chloro-benzotriazole, 1-chloro-benzotriazole, 4- and 5-carboxy-benzotriazole, 1-hydroxy-benzotriazole, 2-mercapto-benzoxazole, 1H-1,2,4-triazole-3-thiol, 5-amino-1,3,4-thiodiazole-2-thiol, and mercapto-benzimidazole.

Various background dyes can be added to the composition to enhance the color of the composition and provide contrast to the copper substrate. Any colorants used should be relatively transparent to the actinic radiation used. In addition the photopolymerization composition can contain various other additives such as adhesion promoters/modifiers, plasticizers, surfactants, dyes, pigments, fillers and other materials which are added to influence characteristics of the composition.

When a photopolymerizable coating is to be used as a permanent resist, such as a solder mask, a chemically or thermally activated crosslinking agent may be incorporated to improve mechanical or chemical properties. Suitable crosslinking agents useful in the present invention are those in the prior art and include those disclosed in Iimure, U.S. Pat. No. 4,961,960 as well as those disclosed in Gervay, U.S. Pat. No. 4,621,043 and Geissler et al., U.S. Pat. No. 4,438,189, such as an adduct of a polyisocyanate compound and an isocyanate group-blocking agent, and formaldehyde condensation resins with melamines, ureas, benzoguanamines and the like.

Photoresist Element Application

The process of the invention is an imaging process to make resist images on a copper clad substrate to enable subsequent processing steps in the fabrication of printed circuits to occur, such as etching or plating, or a permanent coating to make solder resistant images on a printed circuit board. The type of printed circuit manufactured can be single sided, double sided or of multiple layers.

For the primary imaging process, the photopolymerizable resist coating layer is applied as a liquid or a preformed dry film from a multi-ply, transfer element using a lamination process similar to that described in Celeste, U.S. Pat. No. 3,469,982. The multi-ply, photoresist coating element comprises, in order, a temporary support film, e.g., polyethylene teraphthalate, a photoimageable resist coating, and preferably a removable cover sheet, e.g., polyethylene or polypropylene. The photopolymerizable coating layers of this invention are present in range of total thickness from 10 to 100 microns (0.4 to 4 mils) when used over copper clad substrates. If the cover sheet is present, it is first removed and the uncovered surface of the resist coating is laminated to the pre-cleaned copper clad surface of the substrate using heat and/or pressure, e.g., with a conventional hot-roll laminator. Although the laminate is typically imagewise exposed to actinic radiation through the temporary support film, in some instances, the support film may be removed before imaging to improve resolution and other such properties.

The applied photoimageable resist is then imagewise exposed to actinic radiation to harden or insolubilize exposed areas. Any unexposed areas are then completely removed typically with an aqueous 0.85% sodium carbonate developer solution by weight at 30° C. which selectively dissolves, strips or otherwise disperses the unexposed areas within two minutes without adversely affecting the integrity or adhesion of the exposed areas. The developed resist image on the substrate is then exposed to further processing steps in the fabrication of the circuit, such as electrolytic acid copper plating or a copper etching process. Once the exposed photoresist has performed its function, the resist is then removed from the circuit board generally by an aqueous hydroxide based stripping solution, which may contain organic amines or solvents to improve strip speed or to minimize metal attack or staining.

Photoimageable Resist Testing

Print-out Image Test

The test for POI strength is a visual examination of the photoimageable resist laminated to a copper laminate after exposure to actinic irradiation. If no POI is formed, a rating of 0 is given. A rating of 1 indicates that the color contrast between the exposed and unexposed areas is minimal and thus the POI is very weak. A rating of 10 indicates that the color contrast between the exposed and unexposed areas is very large and thus the POI is strong. The absolute rating of an individual POI system may vary slightly from example to example, but relative ratings within an example are quantitative. In general, a POI Test rating of 5–6 is acceptable. It should be noted that some systems do not form a POI, but form a positive image by the photo-bleaching of the background dye. This phenomena is indicated in the examples by the term "bleach."

Delta OD Test

The difference in optical density (OD) at a given wavelength of light was also used as a measure of POI strength. Spectra were taken over a scan of 300 nanometers to 700 nanometers, the lambda maximum determined (typically between 590 and 600 nm) and optical density measured at the maximum for exposed and corresponding unexposed film samples. The difference or delta in OD was then calculated. The greater the difference in optical density between exposed and unexposed portions of photoimageable resist, the stronger the POI.

Differential Scanning Calorimetery Test

A useful simulation of melt coating stability is a Differential Scanning Calorimeter (DSC) Test. Resist compositions were placed into crimped aluminum sample pans and subjected to DSC measurements for an exotherm on a DuPont Model 912 DSC. The samples were heated from room temperature to 250° C. at a rate of 10° C. per minute. An exotherm indicates the onset of instability in the form of polymerization and the presence of an exotherm below 170° C. is unsatisfactory.

EXAMPLES

To further substantiate the invention, the examples below are provided. All component figures are given on a parts by weight of total composition basis unless otherwise noted. Materials used in the examples are:

| | |
|---|---|
| 1,2-Dibromoethanes | |
| DBC | 2,3-Dibromo-3-phenylpropiophenone |
| Leuco Dyes | |
| LCV | Leuco Crystal Violet |
| Photoinitiators | |
| EDAB | Ethyl 4-(dimethylamino)benzoate |
| ITX | Isopropylthioxanthone |
| EMK | Ethyl Michler's Ketone |
| o-Cl-HABI | 2,2'-bis(ortho-chlorophenyl)-4,4',5,5'-tetraphenyl-1,1'-biimidazole |
| TMCH | 4-Methyl-4-trichloromethyl-2,5-cyclohexadienone |
| Monomers | |
| TMPTA | Trimethylol propane triacrylate |
| TMPEOTA | Ethoxylated trimethylol propane triacrylate |
| TEGDMA | Triethylene glycol dimethacrylate |
| Binders | |
| Binder 1 | Styrene/methacrylic acid/methyl methacrylate/ethyl acrylate (20/21/12/38) |
| Binder 2 | Methyl methacrylate/ethyl acrylate/methacrylic acid (44/35/21) |
| Binder 3 | Ethyl acrylate/methacrylic acid methyl methacrylate/styrene (38/21/21/20) |
| Binder 4 | Acrylic acid/methyl methacrylate/ethyl acrylate (12/62/26) |
| Binder 5 | Polymethylmethacrylate (PMMA) |
| Binder 6 | Methyl methacrylate/ethyl acrylate/Methacrylic acid (51/29/20) |
| Other Components | |
| CBT | 4- and 5-Carboxybenzotriazole |
| PVP/PVA | 60/40 Copolymer of polyvinylpyrollidone and polyvinyl acetate |
| PO/EO | 31/1 block copolymer of propylene oxide and ethylene oxide |
| PTSA | p-Toluenesulfonic Acid |
| TAOBN | 1,4,4-Trimethyl-2,3-diazabicyclo[3.2.2]-non-2-ene-N,N-dioxide |

Example 1

This example shows how the claimed compounds are more effective at enhancing color formation when compared on an equimolar basis to a variety of other color enhancing halogenated compounds. In this example, the photoinitiator system is based on benzophenone/ethyl Michler's ketone.

The following stock solution was prepared:

| | |
|---|---|
| Methylene Chloride | 2332.0 g |
| Methanol | 168 g |
| Binder 1 | 780 g |
| TMPEOTA | 273.6 g |
| TMPTA | 19.80 g |
| TAOBN | 0.240 g |
| Benzophenone | 48.0 g |
| EDAB | 20.4 g |
| PVP/PVA | 16.8 g |
| EMK | 1.956 g |
| LCV | 4.560 g |
| Victoria Green Dye | 0.312 g |
| PO/EO | 27.60 g |
| TOTAL | 3693.3 g |

The stock solution was divided into 100 g portions. The following materials were added to each solution and the solutions were board coated to a dry thickness of 1.5 mils. The amounts added correspond to equimolar amounts with the leuco crystal violet in each solution. After lamination to copper the films were exposed through a target for 70 mJ on a PC 130 printer. The printout image of each was judged on a scale of 1 to 10 with 10 being the darkest. A value of 1 is barely visible.

| Solution | Material | Amount (g) | Image Rating |
|---|---|---|---|
| 1 | trans-10,11-dibromodibenzosuberone | 0.124 | 10 |
| 2 | meso-2,3-dibromosuccinic acid | 0.094 | 6*** |
| 3 | 1,2-dibromotetrachloroethane | 0.111 | 10 |
| 4 | meso-1,2-dibromo-1,2-diphenylethane | 0.116 | 6 |
| 5 | 3,4-dibromosulfolane | 0.095 | 4 |
| 6 | 2,3-dibromopropyl carbamate | 0.089 | 3 bleach |

| Solution | Material | Amount (g) | Image Rating |
|---|---|---|---|
| 7 | trans-1,2-dibromocyclohexane | 0.082 | 3 bleach |
| 8 | 2,3-dibromo-2,3-dimethylbutane | 0.083 | 3 bleach |
| 9 | ethyl 2,3-dibromo-3-phenyl propionate | 0.114 | 8 |
| 10 | 2,3-dibromopropylacrylate | 0.092 | 3 bleach |
| 11 | 2,3-dibromopropionamide | 0.079 | 4 |
| 12 | 2,3-dibromosulfolane | 0.095 | 5 |
| 13 | 2,3-dibromo-3-phenylpropiophenone | 0.126 | 10 |
| 14 | trans-1,2-dibromoacenaphthene | 0.107 | 8 |
| 15 | 1,2-dibromoethylbenzene | 0.090 | 6 |
| 16 | 2,3-dibromo-3-phenylpropionic acid | 0.105 | 8 |
| 17 | 5,5-dibromo-2,2-dimethyl-4,6-dioxo-1,3-dioxane | 0.103 | 2 |
| 18 | a,a-dibromo-o-xylene | 0.090 | 2 bleach |
| 19 | a,a dibromomalonamide | 0.088 | 6 |
| 20 | tribromomethylphenyl sulfone | 0.134 | 6 |
| 21 | 2-(2-chlorophenyl)-4,5-diphenyl-imidazole dimer | 0.203 | 3 bleach |
| 22 | 4-methyl-4-trichloromethyl-2,5-cyclohexadienone | 0.077 | 3 bleach |
| 23 | trichloroacetamide | 0.055 | 3 bleach |
| 24 | 9,10-dibromo(+)camphor | 0.105 | 4 bleach |
| 25 | 2,4-bis(2-chlorophenyl)-5-(3,4-dimethoxyphenyl) imidazole dimer | 0.288 | 3 bleach |
| 26 | 2,3-dibromopropanol | 0.074 | 3 |
| 27 | 9,10-dibromostearic acid | 0.150 | 4 |
| 28 | 2,3-dibromo-3-(p-chlorophenyl)-propionic acid | 0.123 | 8 |
| 29 | 3,9-dibromo(+)camphor | 0.105 | 3 bleach |
| 28 | nothing | | 2 bleach |

***Films made with this material were very unstable and tended to darken within a few days.

Example 2

This example shows the effectiveness of the claimed dibromo compounds with a photoinitiator system based on a thioxanthione.

The following stock solution was prepared:

| Material | Amount |
|---|---|
| Methylene Chloride | 744 g |
| Methanol | 56.0 g |
| Binder 3 | 300 g |
| EDAB | 24.00 g |
| ITX | 4.00 g |
| TEGDMA | 72.00 g |
| TAOBN | 0.040 g |
| Victoria Green Dye | 0.120 g |
| CBT | 0.240 g |
| LCV | 1.52 g |
| TOTAL | 1201.9 g |

The stock solution was divided into 100 gram portions. The following materials were added to the solutions. These amounts make each added dibromo compound equimolar with the leuco crystal violet. Each solution was board coated to a 1.5 mil dry thickness on 92A Mylar® polyester film. Each film was laminated to copper and exposed through a phototool on a PC130 printer at 70 mJ. The printout image of each film was visually judged on the 1–10 scale described in Example 1. The results obtained are given below.

| SOLUTION | ADDITIVE | AMOUNT (g) | IMAGE RATING |
|---|---|---|---|
| A | Nothing | 0 | 2 bleach |
| B | TMCH | 0.077 | 1 |
| C | trans-10,11-Dibromodi-benzosuberone | 0.124 | 8 |
| D | 2,3-Dibromo-3-phenyl-propiophenone | 0.125 | 7 |
| E | 2,3-Dibromo-3-phenyl-propionic acid | 0.105 | 2 |
| F | Ethyl 2,3-dibromo-3-phenylpropionate | 0.114 | 2 |
| G | Tribromomethylphenyl sulfone | 0.134 | 2 |
| H | Dibromomalonamide | 0.088 | 1 |
| I | o-Cl-HABI | 0.225 | 4 |
| J | 2,3-Dibromopropion-amide | 0.079 | 2 bleach |
| K | 2,3-Dibromopropyl acrylate | 0.092 | 2 bleach |

Example 3

This example shows the effectiveness of the claimed dibromo compounds with a ketal photoinitiator, which works by a-cleavage.

The following stock solution was prepared.

| MATERIAL | AMOUNT (g) |
|---|---|
| Methylene Chloride | 744 |
| Methanol | 64 |
| Binder 1 | 267 |
| Benzil dimethyl ketal | 8.00 |
| PVP/PVA | 6.00 |
| TMPEOTA | 100.0 |
| TMPTA | 8.00 |
| TAOBN | 0.080 |
| Victoria Green Dye | 0.120 |
| LCV | 1.60 |
| PO/EO | 9.20 |
| TOTAL | 1208 |

The stock solution was divided into 100 gram portions. The following materials were added and the solution was board coated to a dry thickness of 1.5 mils. The films were laminated to copper and exposed through a phototool on a PC-130 printer at a level of 70 mJ. The printout image was judged visually using the scale described in Example 1. The results obtained are given below.

| SOLUTION | ADDITIVE | AMOUNT (g) | IMAGE RATING |
|---|---|---|---|
| A | Nothing | 0 | 2 |
| B | TMCH | 0.079 | 2 |
| C | trans-10,11-Dibromodi-benzosuberone | 0.128 | 9 |
| D | 2,3-Dibromo-3-phenyl-propiophenone | 0.129 | 8 |
| E | 2,3-Dibromo-3-phenyl-propionic acid | 0.108 | 6 |
| F | Ethyl 2,3-dibromo-3-phenylpropionate | 0.117 | 6 |
| G | Tribromomethylphenyl sulfone | 0.138 | 4 |
| H | Dibromomalonamide | 0.081 | 4 |
| I | 2-(2-Chlorophenyl)-4,5-diphenyl-imidazole dimer (o-Cl-HABI) | 0.232 | 6 |
| J | 2,3-Dibromopropion-amide | 0.081 | 4 |
| K | 2,3-Dibromopropyl-acrylate | 0.095 | 2 |

Example 4

This example shows the effectiveness of one of the claimed dibromo compounds in combination with a hexaarylbiimidazole (HABI) photoinitiator. An enhancement in photospeed was also demonstrated.

The stock solution was made up according to the formulation below and separated into six 302.8 gram portions. The other ingredients (shown below) in solution samples S1 through S6 were added to the 302.8 g portions while being stirred. The solutions were coated using an 8 mil knife on 92D Mylar® polyester film such that 1.6 mils of dry film thickness was formed. Two sets of films were laminated to copper laminate panels and exposed on a PC-130 exposure unit at an energy (120 mJ/sq cm) that would achieve 25 S-41 steps. One set of panels was evaluated for POI by the Delta OD Test. The second set of panels was developed at 50% breakpoint using 1% $Na_2CO_3.H_2O$ by weight at 85° F.

| | SOLUTION MAKE-UP IN GRAMS | | | | | | |
|---|---|---|---|---|---|---|---|
| INGREDIENTS | S1 | S2 | S3 | S4 | S5 | S6 | STOCK SOLN |
| Methanol | 16.00 | 16.00 | 16.00 | 16.00 | 16.00 | 16.00 | 115.20 |
| Methylene chloride | 184.00 | 184.00 | 184.00 | 184.00 | 184.00 | 184.00 | 1324.80 |
| Binder 2 | 65.00 | 65.00 | 65.00 | 65.00 | 65.00 | 65.00 | 468.00 |
| TMPEOTA | 26.00 | 26.00 | 26.00 | 26.00 | 26.00 | 26.00 | 187.20 |
| TMPTA | 9.00 | 9.00 | 9.00 | 9.00 | 9.00 | 9.00 | 64.80 |
| ITX | 0.50 | 0.50 | 0.50 | 0.50 | 0.50 | 0.50 | 3.60 |
| EDAB | 2.00 | 2.00 | 2.00 | 2.00 | 2.00 | 2.00 | 14.40 |
| LCV | 0.30 | 0.30 | 0.30 | 0.30 | 0.30 | 0.30 | 2.16 |
| o-Cl-HABI | 2.00 | 0.00 | 2.00 | 0.30 | 0.00 | 0.30 | |
| DBC | 0.00 | 0.30 | 0.30 | 0.00 | 2.00 | 2.00 | |
| TOTAL | 304.8 | 303.1 | 305.1 | 303.1 | 304.8 | 305.1 | 2180.2 |

The results obtained are given below. This example demonstrates that the combination of the dibromo compound, DBC, and the HABI photoinitiator affords both good printout (POI) strength and good photospeed.

| Film | o-Cl-HABI (grams) | DBC (grams) | Energy (mJ/cm2) | S-41 Steps Held | Energy (mJ/cm2) for 25 SH (Caculated) | Relative Photospeed | Delta OD (120 mJ/cm2) |
|---|---|---|---|---|---|---|---|
| 1 | 2.00 | 0.00 | 30 | 23 | 38 | 1 x | 0.28 |
| 2 | 0.00 | 0.30 | 50 | 26 | 44 | 0.86 x | 0.51 |
| 3 | 2.00 | 0.30 | 50 | 27 | 40 | 0.95 x | 0.98 |
| 4 | 0.30 | 0.00 | 30 | 23 | 38 | 1 x | 0.09 |
| 5 | 0.00 | 2.00 | 70 | 25 | 70 | 0.54 x | 1.08 |
| 6 | 0.30 | 2.00 | 70 | 27 | 60 | 0.63 x | 1.12 |

Example 5

This example shows the poor stability of printout image with dibromotetrachloroethane compared to the claimed compounds and the excellent stability of monomer solutions toward thermal polymerization containing these materials compared to other printout enhancers.

The following liquid mixture was prepared:

| | |
|---|---|
| TMPEOTA | 642.4 |
| TMPTA | 34.1 |
| Benzophenone | 176.6 |
| EDAB | 88.0 |
| EMK | 4.06 |
| TAOBN | 0.43 |
| PO/EO | 43.7 |
| LCV | 10.8 |
| TOTAL | 1000.1 |

The solution was divided into ten 90 gram portions, each of which contained 0.972 g of LCV. The following materials were added as indicated in the table below. The total amount of each additive in A-H is equimolar with the LCV.

| Soln. | Additive | Wt. (g) |
|---|---|---|
| A | TMCH | 0.587 |
| B | Tribromomethylphenyl sulfone | 1.022 |
| C | o-Cl-HABI | 1.716 |
| D | trans-10,11-dibromodibenzosuberone | 0.952 |
| E | 1,2-dibromotetrachloroethane | 0.847 |
| F | 2,3-dibromo-3-phenylpropiophenone (DBC) | 0.958 |
| G | Ethyl-2,3-dibromo-3-phenylpropionate | 0.874 |
| H | 2,3-dibromo-3-phenylpropionic acid | 0.801 |
| I | 4-methyl-4-trichloromethyl-2,5-cyclohexadien-1-one (TMCH) + trans-10,11-dibromodibenzosuberone | 0.587 0.476 |
| J | 4-methyl-4-trichloromethyl-2,5-cyclohexadien-1-one (TMCH) + 2,3-dibromo-3-phenylpropiophenone (DBC) | 0.587 0.479 |

Soln. = Solution
Wt. (g) = Additive weight in grams

Each was stirred until dissolved using gentle heating when needed. A small amount of D remained undissolved. 0.60 g of Victoria blue dye was added to each. Each monomer solution was tested by DSC for an exotherm that could signal the onset of polymerization. The table below shows the results of this test. Each liquid was heated in a crimped pan at 10° C. per minute from room temperature to 250° C.

| SOLUTION | ONSET TEMP. (°C.) |
|---|---|
| A | 208 |

-continued

| SOLUTION | ONSET TEMP. (°C.) |
|---|---|
| B | 150 |
| C | 158 |
| D | 234 |
| E | 231 |
| F | 231 |
| G | 227 |
| H | 224 |
| I | 215 |
| J | 211 |

The results were that the solutions containing the claimed compounds each exhibited onset temperatures above 200° C., indicating good stability toward polymerization below this temperature (approximately 200° C.) of solutions containing the claimed dibromo compounds.

Solutions of the following binders were made by dissolving 400 grams of binder in 1200 grams of 93:7 methylene chloride:methanol.

| I | Binder 4 |
|---|---|
| II | Binder 5 |

Solutions for coating were made by combining 100 grams of each binder solution with the following amounts of each monomer mixture, A–J.

| A | 16.66 g |
|---|---|
| B | 16.74 g |
| C | 16.87 g |
| D | 16.73 g |
| E | 16.71 g |
| F | 16.72 g |
| G | 16.71 g |
| H | 16.70 g |
| I | 16.75 g |
| J | 16.75 g |

Each solution was coated on 92A Mylar ® polyester film to produce a dry film of 1.5 mil thickness. Each film was tested fresh (1 day) and after 10 days at room temperature by exposing through a phototool for 70 mJ on a PC 130 Printer. The printout image was determined on a scale of 0–10 where 0 is no image, and 10 is equal to or better than the best images seen. Results are summarized in the table below.

| Film[a] | Fresh POI | 10 Day POI |
|---|---|---|
| A-I | 4 | 2 |
| B-I | 4 | 4 |
| C-I | 6 | 5 |
| D-I | 10 | 10 |
| E-I | 10 | 2 |
| F-I | 9 | 9 |
| G-I | 8 | 7 |
| H-I | 7 | 5 |
| I-I | 9 | 9 |
| J-I | 9 | 9 |
| A-II | 3 | Bleached |
| B-II | 4 | 4 |
| C-II | 2 | 3 |
| D-II | 10 | 10 |
| E-II | 10 | Bleached |
| F-II | 10 | 10 |
| G-II | 9 | 8 |
| H-II | 7 | 7 |
| I-II | 9 | 10 |
| J-II | 9 | 10 |

[a]The letters A–J refer to the coating solutions as given supra. The Roman numerals I and II refer to the two binders tested in this example as given supra

Example 6

This example shows the effectiveness of 2,3-dibromo-3-phenylpropiophenone (DBC) as a printout image enhancing agent in a melt coated formulation.

The following formulations were melt coated at a melt temperature of 300°–400° F. onto polyester base. Lamination of the resulting films to copper and exposure through a phototool at 70 mJ on a PC 130 printer was done. This experiment demonstrated that the A formulation has a moderately strong printout image (rating of 7 on 1–10 scale), whereas the B formulation has a very poor image (rating of 2 on the same 1–10 scale). This is despite the fact that the B formulation contains more LCV than does the A formulation.

| INGREDIENT | A | B |
|---|---|---|
| TMPEOTA | 22.52 | 22.62 |
| TMPTA | 1.19 | 1.19 |
| Benzophenone | 6.22 | 6.22 |
| EDAB | 3.10 | 3.10 |
| EMK | 0.143 | 0.143 |
| PVP/PVA | 1.19 | 1.19 |
| PO/EO | 1.54 | 1.54 |
| LCV | 0.350 | 0.477 |
| Victoria Blue Dye | 0.024 | 0.016 |
| Victoria Green Dye | 0 | 0.008 |
| TMCH[a] | 0.300 | 0.143 |
| 2,3-dibromo-3-phenylpropiophenone (DBC) | 0.170 | 0 |
| Binder 6 | 63.21 | 63.34 |

[a]In this example, the TMCH level in formulation A was raised to a higher level than in formulation B such that the A and B films had equal photospeed

Example 7

This example shows the effectiveness of several substituted dibromochalcones, indanones, stilbenes, and other dibromoketones as printout image enhancing agents. It also shows the effect of electron withdrawing versus electron donating groups present in the printout image enhancing agents upon printout image strengths.

The following stock solution was prepared.

| INGREDIENT | AMOUNT (g) |
|---|---|
| Methylene Chloride | 1798 |
| Methanol | 135 |
| Binder 2 | 628 |
| TMPEOTA | 241.7 |
| Benzophenone | 46.72 |
| EMK | 1.61 |
| EDAB | 19.33 |
| LCV | 3.22 |
| PO/EO | 25.78 |
| TAOBN | 0.967 |

The solution was divided into 150 gram portions. The following materials were added to the indicated solution numbers (see table below). The amounts added are equimolar with the amount of LCV in the solutions.
1 0.100 g TMCH
2 0.164 g 2,3-dibromo-3-phenylpropiophenone (DBC)
3 0.163 g trans-10,11-dibromodibenzosuberone 4 0.170 g 2-bromo-2-(a-bromobenzyl)-1-indanone
5 0.178 g 2,3-dibromo-3-(p-methoxyphenyl)propiophenone
6 0.184 g 2,3-dibromo-3-(p-nitrophenyl)propiophenone
7 0.175 g 2,3-dibromo-3-(p-cyanophenyl)propiophenone
8 0.152 g 1,2-dibromo-1-phenyl-2-(p-methoxyphenyl)ethane
9 0.191 g 1,2-dibromo-1(p-nitrophenyl)-2-(p-dimethylaminophenyl)ethane
10 0.186 g 1,2-dibromo-1,2,2-triphenylethane
11 0.176 g 1,2-dibromo-1,2-dibenzoylethane
12 0.136 g 3,4-dibromo-4-phenyl-2-butanone
13 0.180 g 2-bromo-2-(-bromo-p-cyanobenzyl)-1-indanone
14 0 g Comparative Solution (Nothing added)

The solutions were coated onto 92A Mylar ® polyester film to give 1.5 mil films. The films were laminated to copper panels and exposed through a phototool on a PC-130 Printer at 70 mJ. The printout image (POI) strengths were judged on the 0–10 scale described in earlier examples, with 0 corresponding to no POI, 1 corresponding to a barely visible POI, and 10 corresponding to the best POI previously seen. The results obtained are summarized below.

| FILM | POI STRENGTH |
| --- | --- |
| 1 | 3 |
| 2 | 9 |
| 3 | 10 |
| 4 | 9 |
| 5 | 5 |
| 6 | 10 |
| 7 | 9–10 |
| 8 | 2 |
| 9 | 2 |
| 10 | 2 |
| 11 | 9 |
| 12 | 7 |
| 13 | 9 |
| 14 | 2 |

What is claimed is:

1. A photoimageable composition which comprises:
(a) a substituted 1,2-dihalogenated ethane having the structure:

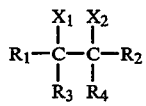

wherein;
$X_1$ and $X_2$ are independently either bromine or chlorine;
$R_1$ is $C_6-C_{10}$ aryl, or aroyl, and;
$R_2$ is $C_6-C_{10}$ aryl, aroyl, acyl, or an electron withdrawing group other than halogen; and
$R_3$ and $R_4$ are independently $C_6-C_{10}$ aryl, $C_1-C_{10}$ alkyl, H, or an electron withdrawing group other than halogen, with the proviso that any two of $R_1$, $R_2$, $R_3$ and $R_4$ groups can form a 5- to 8-membered ring structure;
with the proviso that when $R_1$ or $R_3$ is $C_6-C_{10}$ aryl, $R_2$ and $R_4$ are not aryl;
(b) a leuco dye; and
(c) a photoinitiator or photoinitiator system.

2. The photoimageable composition of claim 1 which additionally contains
(a) at least one ethylenically unsaturated monomer and
(b) at least one polymeric binder.

3. The photoimageable composition of claim 2 in which said polymeric binder is a carboxylic acid containing copolymer binder, wherein the level of carboxylic acid groups allows for development in 0.85% aqueous sodium carbonate by weight at 30° C. within two minutes, having structural units:

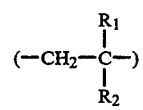

in which:
$R_1$ is H or alkyl;
$R_2$ is phenyl or $CO_2R_3$; and
$R_3$ is H or alkyl.

4. The photoimageable composition of claim 3 wherein the carboxylic acid containing copolymer binder is comprised from the group of structural units consisting of acrylic acid, methacrylic acid, methyl methacrylate, styrene, ethyl acrylate, butyl methacrylate, and butyl acrylate.

5. The photoimageable composition of claim 2, wherein the photoinitiator is selected from the group consisting of benzophenone, 4,4'-bis(diethylamino)benzophenone, 4,4-bis(dimethylamino)benzophenone, thioxanthone, a substituted thioxanthone, benzil dimethyl ketal, 4-methyl-4-trichloromethyl-2,5-cylcohexadienone, ethyl p-dimethylaminobenzoate, and 2-(2-chlorophenyl)-4,5-diphenylimidazole dimer.

6. The photoimageable composition of claim 2 wherein the monomeric component comprises a compound having at least two ethylenically unsaturated groups.

7. The photoimageable composition of claim 6 wherein the monomeric component is selected from the group consisting of tripropylene glycol diacrylate, trimethylolpropane triacrylate, polyoxyethylated trimethylolpropane triacrylate and triethylene glycol dimethacrylate.

8. The photoimageable composition of claim 1 wherein the substituted 1,2-dihalogenated ethane is a 1,2-dibromoethane selected from the group consisting of:
10,11-dibromodibenzosuberone,
2,3-dibromo-3-phenylpropiophenone,
ethyl 2,3-dibromo-3-phenylpropionate,
trans-1,2-dibromoacenaphthene,
2,3-dibromo-3-phenylpropionic acid,
1,2-dibromo-1,2-dibenzoylethane,
3,4-dibromo-4-phenyl-2-butanone,
2,3-dibromo-3-(p-nitrophenyl)propiophenone,
2,3-dibromo-3-(p-cyanophenyl)propiophenone,
2-bromo-2-(alpha-bromobenzyl)-1-indanone, and
2-bromo-2-(alpha-bromo-p-cyanobenzyl)-1-indanone.

9. The photoimageable compositions of claim 1 wherein the leuco dye is:

$CH[C_6H_4N(R)_2]_3$ in which R is alkyl of one to six carbon atoms.

10. The photoimageable compositions of claim 1 wherein the 1,2-dihalogenated ethane comprises 0.01 to 10.0% of the total composition by weight.

* * * * *